United States Patent [19]
Takamiya et al.

[11] 3,980,508
[45] Sept. 14, 1976

[54] PROCESS OF PRODUCING SEMICONDUCTOR DEVICE

[75] Inventors: Saburo Takamiya; Masaharu Hama; Akihiro Kondo, all of Amagasaki, Japan

[73] Assignee: Mitsubishi Denki Kabushiki Kaisha, Japan

[22] Filed: Oct. 1, 1974

[21] Appl. No.: 510,912

[30] Foreign Application Priority Data
Oct. 2, 1973   Japan.............................. 48-110692

[52] U.S. Cl.................................. 148/188; 29/583; 156/8; 156/17; 156/3; 357/56
[51] Int. Cl.²...................................... H01L 21/225
[58] Field of Search............. 148/187, 188; 29/580, 29/583; 156/8, 11, 17, 3; 357/56

[56]          References Cited
          UNITED STATES PATENTS
2,975,080   3/1961   Armstrong........................... 148/188
3,179,860   4/1965   Clark et al.......................... 156/17 X
3,575,644   4/1971   Huth................................. 156/17 X
3,669,775   6/1972   Porter............................... 156/17
3,713,913   1/1973   Wolfle et al........................ 148/187
3,767,485   10/1973  Sahagun............................. 148/188
3,769,109   10/1973  MacRae.............................. 156/3
3,825,454   7/1974   Kikuchi et al...................... 156/17 X
3,842,490   10/1974  Seales.............................. 29/580 X Primary Examiner—William A. Powell
Assistant Examiner—Brian J. Leitten
Attorney, Agent, or Firm—Robert E. Burns; Emmanuel J. Lobato; Bruce L. Adams

[57]          ABSTRACT

An $SiO_2$ film doped with an impurity is formed on at least one portion of a surface of a semiconductor wafer. The wafer is selectively etched after a protective film for selective etching is disposed into a predetermined pattern on the $SiO_2$ film. The impurity included in the $SiO_2$ film can be diffused into the wafer to form a PN junction in the latter. Then the wafer is selectively etched until that surface of the wafer to which the PN junction is exposed is bevelled.

4 Claims, 8 Drawing Figures

PROCESS OF PRODUCING SEMICONDUCTOR DEVICE

BACKGROUND OF THE INVENTION

This invention relates to a process of producing semiconductor devices and more particularly mesa type semiconductor devices.

It is well known that selectively etching processes used in the planar technique can be applied to the production of mesa type semiconductor diodes in order to increase the efficiency thereof. Conventional selective etching processes have been disadvantageous in that one portion of the semiconductor wafer located under each edge of a protective film involved is undercut to form an acute angle and that the sharp edge portion of the wafer thus formed can not be sufficiently covered with a photoresist layer for the subsequent photolithographic process, as well as being easily damaged. Thus that portion of a surface passivation film disposed on the sharp edge portion of the wafer has been etched away in the photolithographic process. Alternatively the sharp edge portion of wafer might be chipped. This has resulted in the surface stabilization being unsatisfactory.

SUMMARY OF THE INVENTION

Accordingly it is an object of the present invention to provide a new and improved process of producing semiconductor devices in which an edge portion of a semiconductor wafer formed in the selective etching step can be made round to prevent the edge portion from becoming sharp while additionally the number of the manufacturing steps decreases.

It is another object of the present invention to provide an improved process of forming a bevelled surface on that surface of a semiconductor wafer to which a PN junction included therein is exposed.

The present invention accomplishes these objects by the provision of a process of producing semiconductor devices comprising the steps of forming an interposed film on at least one portion of a surface of a wafer of semiconductive material, the interposed film being composed of a material higher in an etching rate than the semiconductive material, selectively forming a protective film of etching resisting property on the interposed film, and selectively etching both the wafer and the interposed film through the use of the protective film.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1A:
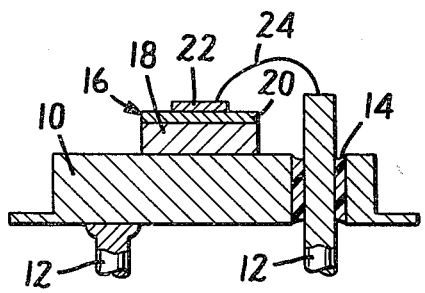
FIG. 1a is a cross sectional view of a mesa type semiconductor diode before it has been subjected to a conventional mesa-etching process.
Figure 1B:
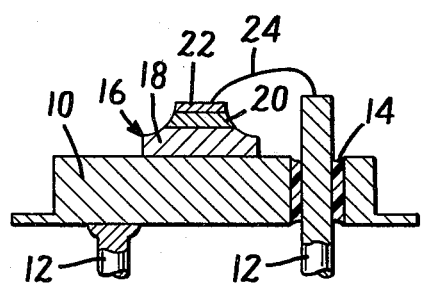
FIG. 1b is a view similar to FIG. 1a but illustrating the diode after having been subjected to the conventional mesa etching process.

Referring now to the drawings and FIGS. 1a and 1b in particular, there is illustrated a mesa type semiconductor diode before and after it is subjected to a conventional mesa-etching process. The arrangement illustrated comprises a metallic stem 10 having an electrical lead 12 connected to one surface, in this case the lower surface as viewed in FIG. 1, of the stem 10 and another electrical lead 12 extending in electrically insulating relationship through one edge portion thereof with an electrically insulating layer 14 interposed therebetween for fixing and insulating purposes. Then a wafer of semiconductive wafer generally designated by the reference numeral 16 is fixedly secured to the other or upper surface of the stem 10. The wafer 16 is shown in FIG. 1 as being a mesa type semiconductor diode including an N type semiconductor region 18 and a P type semiconductor region 20 to form a PN junction therebetween. Then a metallic electrode 22 is disposed in ohmic contact with the exposed surface of the wafer 16 or of the P type semiconductor region 20 and connected to that lead 12 insulatingly extending through the stem 10 via an electrical lead 24.

The mesa etching of the mesa type diode 16 has been previously accomplished after the diode 16 has been fixed or secured to the stem 10 followed by the attachment of the leads 12 and 14 thereto as shown in FIG. 1a. In that event, the electrode 22 partly covering the surface of the diode 16 has acted as a protective member for leaving the required portion of the diode 16 not etched. In mesa type semiconductor diodes, the etched surface thereof might be contaminated. The contamination of the etched surface has caused the resulting diode to be degraded in characteristics leading to an increase in a leakage current. Thus in conventional processes of manufacturing mesa type semiconductor diodes, it has been necessary to subject the diodes to the mesa etching process and rinse them with clean deionized water after which the diodes are dried and coated with a silicone resin in a clean dried atmosphere. Then the coated diodes have been hermetically sealed off in a clean, dried inert gas. The process as above described have been effected after the arrangement as shown in FIG. 1a has been completed. This has resulted in the disadvantage that the production efficiency is very low as compared with the planar technique by which semiconductor diodes can be stabilized while they are left in the form of wafers.

It is well known that this disadvantage, that is, the lowness of the efficiency can be eliminated by applying to the production of mesa type diodes, selective etching processes used in the planar technique. An etching liquid used in mesa etching silicon wafers frequently consists of any of mixtures of nitric acid, hydrofluoric acid and acetic acid and can include in many cases nitric acid, 50% hydrofluoric acid and acetic acid in a proportion of 6:1:2 or 3:1:2 by volume. A protective film used with the selective etching process is required to have a lower etching rate at which the material thereof is etched with the particular etching liquid than an etching rate at which a semiconductive material involved is etched with the same etching liquid. Photoresist materials used with photolithographic technique have a low adhesion to the etching liquid just specified and hence can not be used as materials of the protective film against such etching liquid. As compared with an etching rate at which silicon is etched with the etching solution as above described, a film of silicon nitride ($Si_3N_4$) formed at 850°C has a relative etching rate in the order of 1/1500 or less, a film of silicon dioxide ($SiO_2$) formed at 1150°C has a relative etching rate in the order of one thousandth (1/1000) and a film of evaporated aluminum (Al) has a relative etching rate in the order of one tenth. Thus those films can be used as the protective film for elective etching silicon. However conventional selective etching processes have encountered the difficulties mentioned below.

Figure 2:
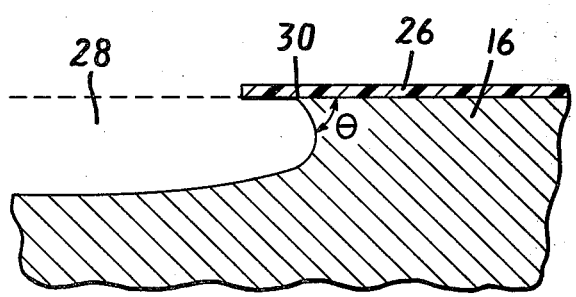
FIG. 2 is a fragmental sectional view in an enlarged scale of that portion adjacent to a border of a semiconductor wafer formed by selectively etching it.

FIG. 2 is a sectional view of that portion adjacent to a border of a semiconductor wafer formed by selectively etching it. As shown in FIG. 2, a semiconductor wafer 16 having a protective film 26 disposed on one face thereof has been selectively etched with an etching liquid such as above described so a portion labelled 28 of the wafer 16 has been removed. Simultaneously that portion of the wafer located under the edge of the protective film 26 is somewhat undercut to form a sharp edge 30. It will readily be understood that the deeper the etched portion of the wafer 16 the more acute an angle $\theta$ at the edge 30. After this selective etching, it is required to cover the surface of the etched wafer with a protective coating to stabilize the surface of the wafer whereby the photoengraving step is entered in order to remove only the required portions of the film. The protective film is preferably formed of a material selected from the group consisting of silicon dioxide ($SiO_2$), silicon nitride ($Si_3N_4$), aluminum oxide ($Al_2O_3$) and photoresist materials. Because of the sharp edge 30, the photoengraving step has unsuccessfully proceeded.

Figure 3:
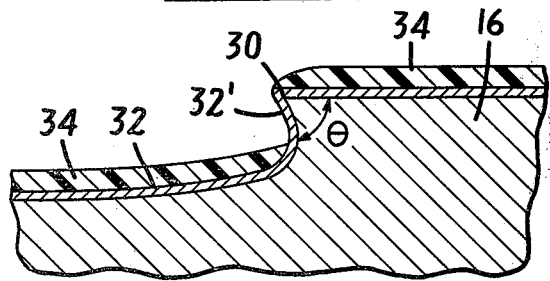
FIG. 3 is a view similar to FIG. 2 but illustrating the wafer portion shown in FIG. 2 after a surface passivation film and a photoresist layer have been successively deposited thereon.

More specifically, after the selective etching, a surface stabilizing coating 32 is formed on the exposed surface of the wafer 16 and a photoresist layer 34 is applied to the surface stabilizing coating 32 as shown in FIG. 3. This results in readiness for the photoengraving process. However the edge 30 of the wafer 16 is too sharp to completely cover that portion 32' at and adjacent the undercut edge 30 of the stabilizing coating 32 with the photoresist layer 34 as shown in FIG. 3 wherein the film portion 32' is shown as being not covered with the photoresist layer 34. Moreover that portion of the wafer adjacent the edge 30 of the wafer 16 is mechanically weak to easily be subject to damage.

Thus, in the photoengraving step, the portion 32' of the surface stabilizing coating is etched away. Alternatively, that portion adjacent the edge 30 of the wafer 16 may be chipped. Accordingly, the surface stabilization has not resulted.

The present invention contemplates to eliminate the disadvantages of the prior art practice as above described.

Figure 4:
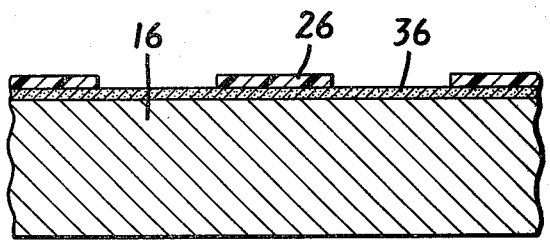
FIG. 4 is a fragmental sectional view of a semiconductor wafer before it has been selectively etched in accordance with the principles of the present invention.

Upon producing semiconductor devices in accordance with the principles of the present invention, a wafer of semiconductive material, for example, silicon has a structure as shown in FIG. 4 so that the wafer is ready for selective etching. The arrangement illustrated comprises a wafer 16 of semiconductive material, in this case, silicon, an interposed film 36 of silicon dioxide ($SiO_2$) doped with an impurity and disposed on at least one portion of the surface of the wafer 16, and a protective film 26 selectively disposed on the interposed film 36, for selective etching. That is, the protective film 26 is disposed in a predetermined pattern on the interposed film 36.

In practicing the present invention, it is required to form the interposed film 36 of a material capable of being etched at a higher rate than the material of the wafer 16 with a etching liquid such as a liquid mixture of nitric acid, hydrofluoric acid and acetic acid. It has been found that the silicon dioxide doped with the impurity has an etching rate equal to from ten to fifty times that of the silicon with the above mentioned etching liquid used.

Figure 5:
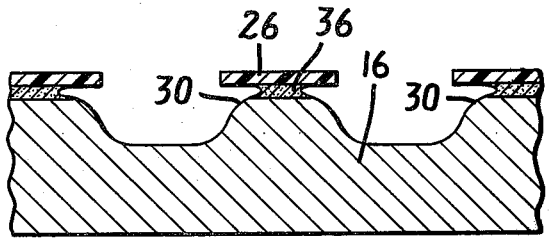
FIG. 5 is a view similar to FIG. 5 but illustrating the semiconductor wafer after it has been selectively etched in accordance with the principles of the present invention.

After having been selectively etched, the wafer 16 has a configuration as shown in FIG. 5. As shown, each of the etched surfaces of the wafer 16 has a surface terminating at a round edge 30 because of the presence of the interposed film 36 whose material is higher in the etching rate than the silicon. Therefore the subsequent photoengraving process does not encounter the problem of cutting a photoresist layer involved on the edge portions of the wafer.

Figure 6:
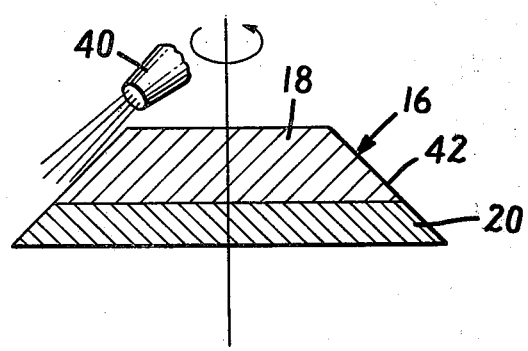
FIG. 6 is a sectional view of a semiconductor diode having a peripheral surface bevelled in the manner well known in the art.

The present invention is also applicable to the step of forming that surface of a semiconductor wafer to which at least one PN junction included therein is exposed, into a bevelled surface. FIG. 6 shows the step of forming such a bevelled surface in accordance with the principles of the prior art. A semiconductor wafer 16 shown in FIG. 6 as including an N type semiconductor region 18 and a P type semiconductor region 20 to form a PN junction therebetween is rotated about the longitudinal axis thereof as shown by the arrow while an abrasive powder from a nozzle 40 is blown against the peripheral surface of the wafer 16 to which the PN junction is exposed. Thereby the peripheral surface of the wafer 16 is formed into a bevelled surface. Following this the entire surface of the wafer is etched away to such an extent that a surface layer of from several to scores of microns thereof is removed from the wafer along with chips due to the abrasion.

Figure 7:
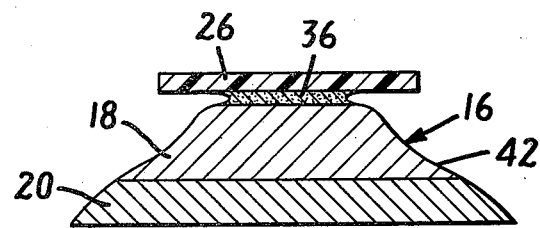
FIG. 7 is a sectional view of a semiconductor diode having a peripheral surface bevelled in accordance with the process of the present invention.

According to the principles of the present invention, a semiconductor wafer including at least one PN junction is provided on at least one portion of the surface thereof with an interposed film subsequently overlaid by a protective film in a predetermined pattern as in the arrangement of FIG. 4. The arrangement thus formed is selectively etched in the manner as above described until an arrangement as shown in FIG. 7 is yielded. In FIG. 7 like reference numerals designate the components identical to those shown in FIGS. 3 and 5. Thus the semiconductor wafer 16 has the bevelled surface 42 formed by selective etching without the necessity of blowing an abrasive powder against the wafer.

The present invention has several advantages. For example, because of the presence of the interposed film including an impurity, the succeeding diffusion step can utilize that impurity as an impurity source to form a PN junction in the wafer. Thus the purpose of the interposed film is not only to form the round edge of the wafer by selective etching but also to provide an impurity source in the diffusion step. From this it will be appreciated that the number of the manufacturing steps is not increased. Also a multiplicity of semiconductor elements formed in a single semiconductor wafer can be simultaneously subjected to the bevelling step, because one semiconductor element with a bevelled surface is formed below each portion of the protective film. In contrast, the prior art practice has been to bevel a peripheral surface of a single semiconductor element for each wafer.

While the present invention has been illustrated and discribed in conjunction with a few preferred embodiments thereof it is to be understood that various changes and modifications may be resorted to without departing from the spirit and scope of the present invention.

What we claim is:

1. A process of producing a semiconductor device, comprising:
   a. providing a silicon wafer having a major surface;
   b. disposing on a portion of said major surface a doped silicon dioxide film, said doped silicon dioxide film being doped with an impurity to impart thereto an etching rate of from about ten to about fifty times the etching rate of silicon;
   c. disposing on a portion of said doped silicon dioxide film a protective film of etchant resistant material to define an etching mask for protecting portions of said doped silicon dioxide film underlying said protective film, and for protecting the corresponding portions of said major surface which underlie said portions of said doped silicon dioxide underlying said protective film; and
   d. etching portions of said doped silicon layer and underlying major surface unprotected by said protective film.

2. A process of producing a semiconductor device, according to claim 1, further comprising: diffusing said impurity with which said silicon dioxide film is doped into said silicon wafer.

3. A process of producing a semiconductor device, according to claim 1, wherein said silicon wafer includes regions of opposite conductivity type forming at least one PN junction therein.

4. A process of producing a semiconductor device, according to claim 1; wherein said protective film is disposed overlying a portion of said major surface with a portion of said major surface about a periphery of said protective film unprotected; wherein said silicon wafer is etched to form a bevelled surface portion about said protective film and having a perimeter similar to the periphery of said protective film; and wherein said silicon wafer includes regions of opposite conductivity type forming a least one PN junction having a portion exposed at said bevelled surface portion.

* * * * *